(12) United States Patent
Anderson et al.

(10) Patent No.: US 6,281,437 B1
(45) Date of Patent: Aug. 28, 2001

(54) METHOD OF FORMING AN ELECTRICAL CONNECTION BETWEEN A CONDUCTIVE MEMBER HAVING A DUAL THICKNESS SUBSTRATE AND A CONDUCTOR AND ELECTRONIC PACKAGE INCLUDING SAID CONNECTION

(75) Inventors: Steven W. Anderson, Newark Valley; Gregg J. Armezzani, Endwell; Daniel P. Labzentis, Apalachin, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/437,506

(22) Filed: Nov. 10, 1999

(51) Int. Cl.$^7$ ..................................... H01L 23/02
(52) U.S. Cl. ......................... 174/52.4; 361/749; 361/760
(58) Field of Search ..................... 361/749, 751, 361/720, 760, 807; 174/255, 52.4; 257/678; 439/17

(56) References Cited

U.S. PATENT DOCUMENTS

| | | |
|---|---|---|
| 4,937,707 | 6/1990 | McBride et al. . |
| 4,967,950 | 11/1990 | Legg et al. . |
| 4,987,100 | 1/1991 | McBride et al. . |
| 5,057,969 | 10/1991 | Ameen et al. . |
| 5,065,506 | 11/1991 | Kiribayashi . |
| 5,115,964 | 5/1992 | Ameen et al. . |
| 5,159,535 | 10/1992 | Desai et al. . |
| 5,170,931 | 12/1992 | Desai et al. . |
| 5,261,155 | 11/1993 | Angulas et al. . |
| 5,321,583 | * 6/1994 | McMahon ............................. 361/770 |
| 5,367,435 | 11/1994 | Andros et al. . |
| 5,435,732 | 7/1995 | Angulas et al. . |
| 5,519,936 | 5/1996 | Andros et al. . |
| 5,561,323 | 10/1996 | Andros et al. . |
| 5,633,533 | 5/1997 | Andros et al. . |
| 5,737,191 | 4/1998 | Horiuchi et al. . |
| 5,773,884 | 6/1998 | Andros et al. . |

* cited by examiner

*Primary Examiner*—Shawn Riley
(74) *Attorney, Agent, or Firm*—Lawrence R. Fraley

(57) ABSTRACT

An electrical connection between a flexible circuitized substrate and a separator conductor is formed wherein the substrate's dielectric member has a region of reduced thickness immediately adjacent the portion of the substrate's conductor that is being connected (e.g., using thermocompression bonding) to the separate conductor (e.g., a chip's contact site or a solder ball thereon). Heat and pressure is applied to form the bond between both conductors, this heat passing through the reduced thickness dielectric while appropriate pressure is applied. The reduced thickness assures heat flow (and possibly displacement of the dielectric in this region, e.g., it "melts back") to thus facilitate bond formation, but also is able to positively retain several conductors of the substrate in spaced alignment during the bonding to respective solder balls or chip contact sites.

36 Claims, 1 Drawing Sheet

METHOD OF FORMING AN ELECTRICAL CONNECTION BETWEEN A CONDUCTIVE MEMBER HAVING A DUAL THICKNESS SUBSTRATE AND A CONDUCTOR AND ELECTRONIC PACKAGE INCLUDING SAID CONNECTION

TECHNICAL FIELD

The invention relates to flexible circuitized substrates and particularly to such substrates which are adapted especially for being electrically coupled to electrical conductors such as contact sites on an integrated circuit chip, a copper pad on a printed circuit board (PCB), etc.

BACKGROUND OF THE INVENTION

Flexible circuitized substrates (often called simply "flex circuits" in the industry) are well known for providing effective connections between electronic components as may be found in information handling (e.g., personal computers (PCs), mainframe processors, etc.) and other electrical systems. One particular usage for such substrates is to electrically couple, directly or indirectly, an integrated circuit (semiconductor) chip to a PCB, such as may be found in a typical PC. Such a structure is often referred to in the industry as an electronic package, which will include a flexible substrate, a chip electrically coupled to the circuitry of the substrate, and perhaps a heatsink-stiffener component, all of which are designed for being mounted on and coupled to a PCB. Numerous examples of such electronic packages are known, with some representative examples being defined in the following patents, all of which are assigned to the same assignee as the present invention and are incorporated herein by reference:

U.S. Pat. No. 4,937,707—McBride

U.S. Pat. No. 4,967,950—Legg et al

U.S. Pat. No. 4,987,100—McBride, et al

U.S. Pat. No. 5,057,969—Ameen et al

U.S. Pat. No. 5,115,964—Ameen et al

U.S. Pat. No. 5,159,535—Desai et al

U.S. Pat. No. 5,170,931—Desai et al

U.S. Pat. No. 5,261,155—Angulas et al

U.S. Pat. No. 5,367,435—Andros et al

U.S. Pat. No. 5,435,732—Angulas et al

U.S. Pat. No. 5,519,936—Andros et al

U.S. Pat. No. 5,561,323—Andros et al

U.S. Pat. No. 5,633,533—Andros et al

U.S. Pat. No. 5,773,884—Andros et al

In Ser. No. 08/883,167, now U.S. Pat. No. 6,093,894, the flexible circuitized substrate includes a uniformly thick polyimide dielectric base layer having copper circuitry located thereon which in turn is designed for being directly coupled to a semiconductor chip. As explained in this application, the preferred approach for providing such a connection is to use what is referred to in the industry as thermocompression (TC) bonding, a well known procedure for bonding relatively small conductors. During such TC bonding, the bonder's thermode (anvil) is placed in direct contact with the uniformly thick dielectric while the circuit line or pad of the substrate engages the corresponding contact site of the chip. Heat and pressure normally used in TC bonding is applied from the dielectric's side, resulting is deformation (melting away) of the dielectric and a bond between the two metallic conductors (circuit line or pad and chip contact site). The bonding heat thus transfers through the interim dielectric to the copper circuit line or pad and corresponding contact site.

It has been discovered that an effective connection between a flexible circuitized substrate and a semiconductor chip can be achieved quickly and effectively by reducing the thickness of the dielectric in the region immediately below the circuit line or pad which is being bonded to the chip. Effective heat transference and a successful bond is attained, utilizing convention TC bonding apparatus. Such a connection is also attainable between the flexible substrate and several extremely small solder ball elements, should such elements be preferred for the chip (e.g., located on respective ones of the chip's contact sites).

It is believed that such an electrical connection and the products resulting therefrom will constitute significant advancements in the art.

OBJECTS AND SUMMARY OF THE INVENTION

It is a primary object of the present invention to enhance the art of electrical connections between flexible circuitized substrates and external conductors such as contact sites on a semiconductor chip.

It is another object of the invention to provide an electrical connection and various electrical circuitized structures using same which can be formed expeditiously and in a manner which makes the invention particularly adaptable to mass production.

According to one aspect of the invention, there is provided a method of forming an electrical connection comprising providing a dielectric layer having a first portion with a first thickness and a second portion with a second thickness, the second thickness of the second portion being less than the first thickness of the first portion, providing at least one conductive member on both the first and second portions of the dielectric layer, providing an electrical component having at least one conductor, and applying heat and/or pressure onto only the second portion of the dielectric layer and the at least one conductive member through the second portion to form an electrical connection between the at least one conductive member and the at least one conductor.

According to another aspect of the invention, there is provided a method of forming an electronic package comprising the steps of providing an electrical component having at least one conductor, providing a flexible circuitized substrate including a dielectric layer having a first portion with a first thickness and a second portion with a second thickness and at least one conductive member on both of the first and second portions of the dielectric layer, aligning the at least one conductive member with the at least one conductor, and forming an electrical connection between the at least one conductive member and the at least one conductor to thereby electrically connect the flexible circuitized substrate and the electrical component and form the electronic package.

According to still another aspect of the invention, there is provided an electrical connection comprising at least one conductor, and a substrate including a dielectric layer having a first portion with a first thickness and a second portion with a second thickness, the second thickness of the second portion being less than the first thickness of the first portion, and at least one conductive member on both the first and second portions of the dielectric layer, the at least one conductive member and the at least one conductor being bonded together to form the electronic connection.

According to yet another aspect of the invention, there is provided an electronic package comprising a flexible circuitized substrate including a dielectric layer having a first portion with a first thickness and a second portion with a second thickness less than the first thickness, the flexible circuitized substrate not including a cover layer or the like on the at least one conductive member, at least one conductive member positioned on the dielectric layer over both the first and second portions, and an electrical component including at least one conductor, the conductor bonded to the at least one conductive member of the flexible circuitized substrate of the dielectric layer.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

Figure 1:
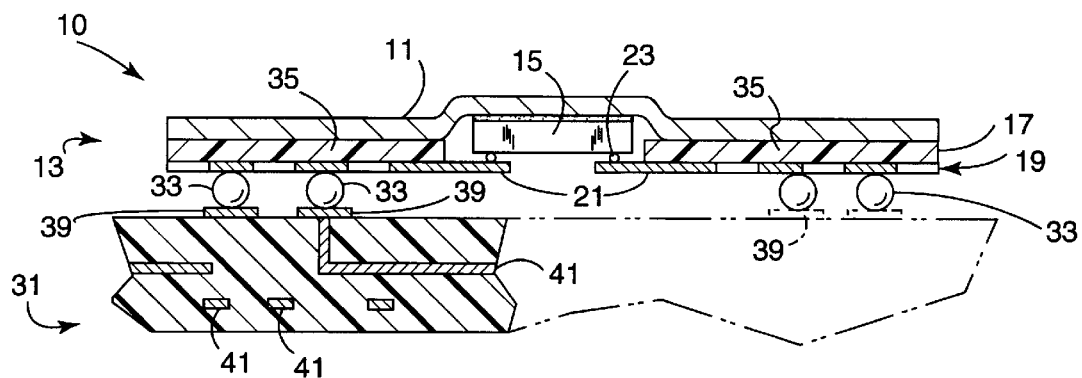
FIG. 1 is a view of an electronic package of the type that may readily use the teachings of the present invention.

In FIG. 1, there is shown an electronic package 10 of the type that may readily use the teachings of the instant invention. Package 10 includes a heat sinking plate 11 to which is secured a flexible circuitized substrate 13. A semiconductor chip 15 is also bonded to plate 11 for enhanced heat sinking. Plate 11 is preferably copper or other suitable metal. The flexible circuitized substrate includes a dielectric layer 17 (e.g., polyimide) and at least one conductive circuit layer (e.g., copper) 19 thereon. Alternatively, polyester may be used for layer 17. Layer 19, or at least the projecting ends 21 thereof, may be of the aforementioned copper or also aluminum, gold or alloys thereof. As seen in FIG. 1, the conductive layer includes a plurality of cantilever leads 21 that project from the dielectric 17 for being electrically coupled to contact sites 23 and/or solder balls 71 (FIG. 3) of/on chip 15. To couple package 10 to an awaiting substrate 31 (e.g., a PCB), package 10 may include a plurality of solder balls 33 or the like which, as shown, are electrically coupled to respective pads 35 of the conductive circuitry 19, which pads in turn form part of this circuitry and are electrically coupled to selected ones of the cantilever projected leads 21. Thus, solder balls 33 provide an electrical coupling between chip 15 and corresponding pads 39 of substrate 31. As shown, these pads 39 may in turn be electrically coupled to internal conductive planes (e.g., 41) of the underlying substrate.

It is to be understood that the above package, also referred to in the industry as a tape ball grid array (TBGA) package, represents but one type of package that may readily use the teachings of this invention. More specifically, the invention is directed to packages and the like which utilize flexible circuitized substrates, and even more particularly those flexible circuits which utilize a relatively thin dielectric layer (e.g., polyimide) and at least one conductive circuit layer thereon. The invention's teachings extend to the formation of any electrical connection between such a flexible substrate and corresponding conductor, regardless of whether these are part of an electronic package of the type described above.

As described in the aforementioned pending immediate parent application, a thermocompression bond is formed between a flexible circuit and corresponding conductor wherein the thermocompression bonder's thermode directly engages and thus heats the dielectric layer opposite the part of the circuitry which is being bonded to the respective conductor. In this application, the thickness of the dielectric is maintained constant from the location of thermode contact backward through the remainder of the flexible circuit. It is understood that one primary reason for attempting such a connection is because, typically, several individual, relatively narrow circuit conductors located in a closely spaced orientation to respective conductors of a similar, high density pattern was accomplished using the constant thickness dielectric as a means for assuring the circuit line positioning during bonding. In a package such as a TBGA package shown in FIG. 1, a total of 1,521 such conductors may be required to bond to the corresponding conductor sites of the internal chip. Clearly, this highly dense arrangement necessitates an extremely precise bonding operation because even the shorting of but one pair of adjacent circuit lines in such a package would render the final package inoperable.

Applicants have found, quite surprisingly, that they are able to substantially reduce the thickness of the dielectric layer 17 to a second thickness ("T2") from a typical, original thickness ("T1") and provide an enhanced method of forming electrical coupling between leads 21' and sites/balls 23. By way of example, when using a polyimide dielectric layer 17 having a thickness ("T1") of from only about 0.001 inch to about 0.005 inch, a second thickness ("T2") of from only about 0.0001 inch to about 0.002 inch was possible while enhancing heat flow from the thermocompression bonder's thermode 51 (FIG. 2) through this thinned section of dielectric to sufficiently heat the projecting conductor 21' and corresponding chip contact site (pad) 23, thus forming an effective connection therebetween. Surprisingly, the thinner portion allowed usage of increased thermode temperatures (in one example, to about 600° C.–700° C. from the typical 500° C. temperature used in convention bonding) to thus increase bonding rates and still assure precise, spaced alignment of several individual leads 21 relative to one another and to the corresponding dense pattern of contact sites 23 (or solder balls 71, as shown in FIG. 3). During such a bonding operation, it is understood that both conductive member 21 and conductor 23 (or ball 71) are heated to this 600° C. to 700° C. range. In addition to thermocompression bonding, it is also possible to use the teachings of the invention in "gang bonding" or laminating processes to form the desired couplings. Understandably, in accordance with the teachings herein, several such projecting leads 21' are simultaneously coupled to a similar number of chip conductors, thus rendering the invention particularly suitable for being made on a mass production basis. For a flexible circuitized substrate having a dielectric thickness within the range cited above, it is preferred to provide a thickness reduction of from about 25% to slightly less than 100% of the dielectric's typical, original thickness "T1". Such reductions are possible while still assuring precise conductor 21' alignment during bonding, as well as efficient heat transference from the bonding thermode 51 through this thin material sufficiently to form the desired bond between the two conductive members. Chip contact sites (pads) 23 may be comprised of aluminum, copper, gold and alloys thereof.

Figure 2:
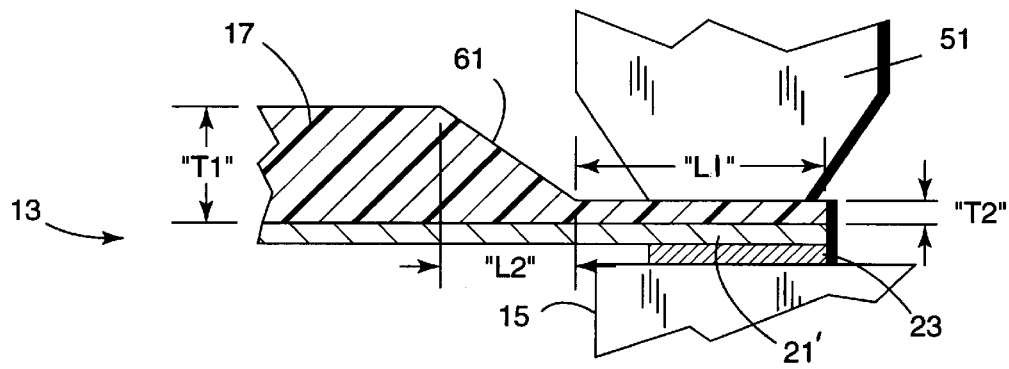
FIG. 2 is a much enlarged, partial view, of one embodiment of an electrical connection that may be formed using the teachings of the invention.
Figure 3:
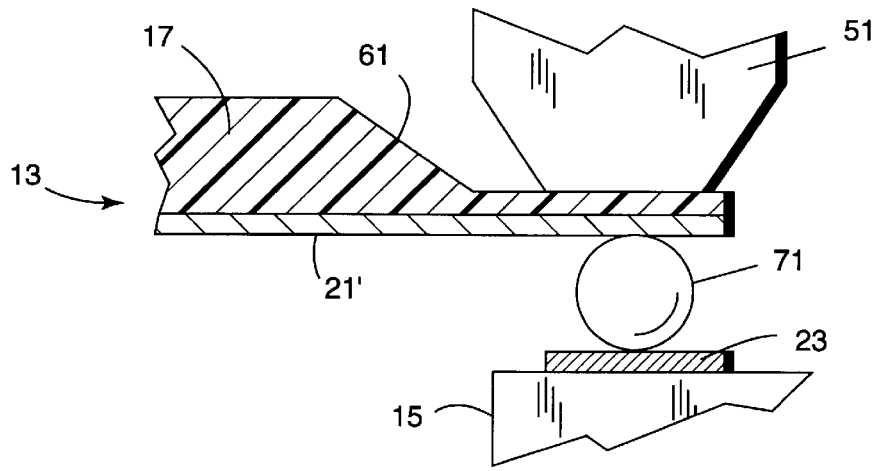
FIG. 3 is another much enlarged, partial view of another embodiment of an electrical connection that may be formed in accordance with the teachings of the present invention.

In the embodiment of FIG. 2, it is also seen that the thinned projection portion of dielectric 17 has a length, denoted as "L1", and an interim portion denoted by the dimension "L2". The remaining portion (that to the left in FIGS. 2 and 3) is of the thicker dimension cited above and typically remains of this thickness throughout the remainder of the flexible substrate. In one example, dimension "L1" may range from about 0.002 inch to about 0.0025 inch, while the interim portion ("L2") of the dielectric 17 ranged from a thickness of "T1" to "T2" over its length. As seen in FIG. 2, this interim portion includes an angular surface 61, thus forming a substantially tapered region from the thicker part of the dielectric to the much thinner region. When using polyimide or the like dielectric material for dielectric member 17 at the thicknesses described above, it is preferred that circuit member 21' have an overall thickness of from about 0.0012 inch to about 0.005 inch. As stated, this conductor is preferably of copper and may be applied to the dielectric layer 17 using conventional technology.

According to one aspect of the invention, an effective thermocompression bond was attained for the embodiment of FIG. 2 by applying heat within the range of about 600° C. to about 700° C. for a brief time period of only about 0.1 to about 2.0 seconds. The amount of pressure applied by the thermode at these temperatures will preferably range from about 50 Newtons (N) to about 250 Newtons (N). Heat and pressure are preferably applied after conductor 21' physically engages pad 23 or ball 71.

It is seem in FIG. 2, as well as FIG. 3, that the conductor 21' extends across both the first and second portions of the dielectric material 17, the first portion being the portion of the greater thickness "T1" and the second portion being that having the lesser thickness and denoted by the dimension "L1". As understood, the thickness of the interim region as shown in FIGS. 2 and 3 and denoted by the dimension "L2" varies to thus provide the substantially tapered configuration shown. It is understood that an angular or tapered shape for surface 61 is not essential in the present invention in that this surface could be substantially perpendicular to both of the planar external surfaces of the dielectric dual thickness portions.

In the embodiment of FIG. 2, the conductor 23 of the electrical component (chip) 15 may be made of conventional material known in the art, including aluminum, copper, chromium, gold and alloys thereof. Preferably, the conductor is in the form of a contact pad, which configuration is also known in the art. As stated, the corresponding conductive member (e.g., circuit line) 21' is preferably of copper.

In FIG. 3, there is shown an alternative embodiment of an electrical connection that can be formed in accordance with the teachings of the present invention. In this embodiment, a solder ball member 71 is preferably positioned between the chip's contact pad 23 and the projecting conductor 21'. The conductor 21' is bonded directly to the solder ball, using the similar temperatures and pressures applied above in the embodiment of FIG. 2. An effective connection between the two metallic conductors 21' and 71 is readily attained. A preferred composition for the solder ball 71 is that having a lead (Pb) and tin (Sn) content. More preferably, the solder balls may be comprised of 90:10 Pb:Sn and 63:37 Pb:Sn material. As seen in FIG. 3, the relative thicknesses and shape for the flexible circuitized substrate 13 are similar to those for the substrate 13 in FIG. 2. As in the case of the FIG. 2 embodiment, several electrical connections were formed between the conductive members of the substrate and corresponding solder balls. In one example, a total of 1,521 electrical connections may be simultaneously formed for a package of the type shown in FIG. 1. Each conductive member 21' possessed a thickness similar to that of the conductive member in FIG. 2, this being from about 0.0012 inch to about 0.005 inch.

Thus there have been shown and described a method of forming an electrical connection between two highly dense patterns of electrical conductors using the application of heat and pressure (e.g., as used in a thermocompression bonding operation) to simultaneously form several electrical connections between such patterns. As described, these connections are formed between a flexible circuitized substrate of relatively thin construction and the highly dense pattern of contact sites typically associated with an extremely small semiconductor chip. Satisfactory couplings are attainable through the use of a substantially reduced dielectric layer in the region of the bond formation, while, surprisingly, assuring the proper spaced orientations of each conductor of the substrate during such a relatively harsh procedure, yet while also assuring effective heat transference through the dielectric necessary to effect such couplings. The reduced dielectric thickness also provides enhanced operational capabilities for package 10, one example being significantly less capacitance between the conductive circuitry and a ground plane located opposite the circuitry and separated by the much narrower dielectric. During the formation of the connections described herein, it is understood that at least a portion of the thinner dielectric layer becomes displaced ("melts back"), leaving only the projecting conductive member and associated conductor pair at the respective connection locations.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of forming an electrical connection between a conductive member and a conductor, said conductive member comprising:

providing a dielectric layer having a first portion with a first thickness and a second portion with a second thickness, said second thickness of said second portion being less than said first thickness of said first portion;

providing at least one conductive member on both said first and said second portions of said dielectric layer;

providing an electrical component having at least one conductor; and applying heat and/or pressure onto only said second portion of said dielectric layer and said at least one conductive member through said second portion to form an electrical connection between said at least one conductive member and said at least one conductor.

2. The method of claim 1 wherein said applying of heat and/or pressure further includes positioning said at least one conductive member in contact with said at least one conductor prior to applying said heat and/or pressure.

3. The method of claim 1 wherein said applying of said heat and/or pressure comprises thermocompression bonding.

4. The method of claim 1 wherein said applying of said heat and/or pressure comprises heating said second portion of said dielectric layer, said at least one conductive member and said at least one conductor to a temperature of about 600° C. to about 700° C.

5. The method of claim 1 wherein said applying of said heat and/or pressure comprises the set of applying pressure to said second portion of said dielectric layer and said at least one conductive member from about 50N to about 250N.

6. The method of claim 1 wherein said applying of said heat and/or pressure comprises gang bonding or laminating.

7. A method of forming an electronic package including a flexible circuitized substrate and an electrical component comprising the steps of:

providing an electrical component having at least one conductor;

providing a flexible circuitized substrate including a dielectric layer having a first portion with a first thickness and a second portion with a second thickness and at least one conductive member on both of said first and second portions of said dielectric layer;

aligning said at least one conductive member with said at least one conductor; and forming an electrical connection between said at least one conductive member and said at least one conductor to thereby electrically connect said flexible circuitized substrate and said electrical component and form said electronic package.

8. The method of claim 7 wherein the formed electronic package is a TBGA component.

9. The method of claim 7 wherein said applying of heat and/or pressure further includes positioning said at least one conductive member in contact with said at least one conductor prior to applying said heat and/or pressure.

10. The method of claim 7 wherein said applying of said heat and/or pressure comprises thermocompression bonding.

11. The method of claim 7 wherein said applying of said heat and/or pressure comprises heating said second portion of said dielectric layer, said at least one conductive member and said at least one conductor to a temperature of about 600° C. to about 700° C.

12. The method of claim 7 wherein said applying of said heat and/or pressure comprises applying pressure to said second portion of said dielectric layer and said at least one conductive member from about 50N to about 250N.

13. The method of claim 7 wherein said applying of said heat and/or pressure comprises gang bonding or laminating.

14. An electrical connection comprising:

at least one conductor; and a substrate including a dielectric layer having a first portion with a first thickness and a second portion with a second thickness, said second thickness of said second portion being less than said first thickness of said first portion, and at least one conductive member on both said first and second portions of said dielectric layer, said at least one conductive member and said at least one conductor being bonded together to form said electrical connection.

15. The electrical connection of claim 14 wherein said at least one conductor forms part of an integrated circuit chip.

16. The electrical connection of claim 15 wherein said at least one conductor is a contact pad.

17. The electrical connection of claim 16 where said contact pad is comprised of a material selected from the group consisting of copper, aluminum, chromium, gold and alloys thereof.

18. The electrical connection of claim 14 wherein said dielectric layer of said substrate is comprised of polyimide or polyester.

19. The electrical connection of claim 14 wherein said first thickness of said first portion of said dielectric layer is from about 0.001 inch to about 0.005 inch.

20. The electrical assembly of claim 19 wherein said second thickness of said second portion of said dielectric layer is from about 0.0001 inch to about 0.002 inch.

21. The electrical assembly of claim 14 wherein said at least one conductive member is comprised of a material selected from the group consisting of chromium, copper, aluminum and alloys thereof.

22. The electrical connection of claim 21 wherein said at least one conductive member thickness is from about 0.0012 inch to about 0.005 inch.

23. The electrical connection of claim 14 wherein said at least one conductor is a solder ball.

24. The electrical connection of claim 23 wherein said solder ball is of a solder material selected from the group consisting of 90:10 Pb:Sn and 63:37 Pb:Sn.

25. An electronic package comprising:

a flexible circuitized substrate including a dielectric layer having a first portion with a first thickness and a second portion with a second thickness less than said first thickness, said flexible circuitized substrate not including a cover layer or the like on said at least one conductive member;

at least one conductive member positioned on said dielectric layer over both said first and second portions; and an electrical component including at least one conductor, said conductor bonded to said at least one conductive member of said flexible circuitized substrate of said dielectric layer.

26. The electronic package of claim 25 wherein said flexible circuitized substrate is a printed circuit substrate.

27. The electronic package of claim 26 wherein said dielectric layer of said flexible circuitized substrate is comprised of polyimide or polyester.

28. The electronic package of claim 25 wherein said second thickness of said second portion of said dielectric layer is from about 0.0001 inch to about 0.002 inch.

29. The electronic package of claim 25 wherein said at least one conductive member is comprised of a material selected from the group consisting of copper, gold, aluminum or alloys thereof.

30. The electronic package of claim 29 wherein said at least one conductive member thickness is from about 0.0012 inch to about 0.005 inch.

31. The electronic package of claim 25 wherein said electrical component is an integrated circuit chip.

32. The electronic package of claim 31 wherein said at least one conductor of said integrated circuit chip is a contact pad.

33. The electronic package of claim 32 wherein said contact pad is comprised of a material selected from the group consisting of copper, aluminum, gold and alloys thereof.

34. The electronic package of claim 25 wherein said at least one conductor is a solder ball.

35. The electronic package of claim 34 wherein said solder ball is of a solder material selected from the group consisting of 90:10 Pb:Sn and 63:37 Pb:Sn.

36. The invention of claim 25 wherein said electronic package is a TBGA component.

* * * * *